United States Patent
Maeda et al.

(10) Patent No.: US 11,088,074 B2
(45) Date of Patent: Aug. 10, 2021

(54) SEMICONDUCTOR DEVICE AND METHOD FOR MANUFACTURING SAME

(71) Applicant: Mitsubishi Electric Corporation, Tokyo (JP)

(72) Inventors: Kazuhiro Maeda, Tokyo (JP); Takayuki Hisaka, Tokyo (JP); Hitoshi Kurusu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/472,559

(22) PCT Filed: Apr. 4, 2017

(86) PCT No.: PCT/JP2017/014100
§ 371 (c)(1),
(2) Date: Jun. 21, 2019

(87) PCT Pub. No.: WO2018/185839
PCT Pub. Date: Oct. 11, 2018

(65) Prior Publication Data
US 2020/0020632 A1 Jan. 16, 2020

(51) Int. Cl.
*H01L 23/528* (2006.01)
*H01L 23/31* (2006.01)
(Continued)

(52) U.S. Cl.
CPC ........ *H01L 23/5283* (2013.01); *H01L 23/315* (2013.01); *H01L 23/3171* (2013.01);
(Continued)

(58) Field of Classification Search
None
See application file for complete search history.

(56) References Cited

U.S. PATENT DOCUMENTS 5,408,742 A * 4/1995 Zaidel ................. H01L 23/5221
257/E23.143
5,789,791 A * 8/1998 Bergemont ......... H01L 23/4824
257/401
(Continued)

FOREIGN PATENT DOCUMENTS

JP H5-335343 A 12/1993
JP 4284639 B2 6/2009
(Continued)

OTHER PUBLICATIONS

Takayuki Hisaka et al., Simultaneous achievement of high performance and high reliability on a 38/77 GHz InGaAs/AlGaAs Phemtmmic, IEICE Electronics Express, Apr. 25, 2010, vol. 7, No. 8, p. 558-562, Cambridge MA, USA.
(Continued)

*Primary Examiner* — Andres Munoz
(74) *Attorney, Agent, or Firm* — Studebaker & Brackett PC (57) ABSTRACT

A multi-finger transistor including plural control electrodes (2), plural first electrodes (3), and plural second electrodes (4) is provided on a semiconductor substrate (1). A resin film (14,15) covers the transistor. A first wiring (8) electrically connecting the plural first electrodes (3) to one other is provided on the resin film (14,15). The resin film (14,15) covers contact portions between the first wiring (8) and the plural first electrodes (3). A first hollow structure (16) sealed with the resin film (14,15) is provided around the plural control electrodes (2) and the plural second electrodes (4).

5 Claims, 8 Drawing Sheets

(51) Int. Cl.
    *H01L 23/522*     (2006.01)
    *H01L 23/482*     (2006.01)
    *H01L 29/417*     (2006.01)
    *H01L 29/423*     (2006.01)
    *H01L 29/778*     (2006.01)
    *H01L 21/768*     (2006.01)
    *H01L 21/764*     (2006.01)

(52) U.S. Cl.
    CPC ...... *H01L 23/4821* (2013.01); *H01L 23/4824* (2013.01); *H01L 23/5222* (2013.01); *H01L 29/41725* (2013.01); *H01L 29/42316* (2013.01); *H01L 21/764* (2013.01); *H01L 21/768* (2013.01); *H01L 23/5221* (2013.01); *H01L 29/778* (2013.01)

(56) References Cited

U.S. PATENT DOCUMENTS

| | | | | |
|---|---|---|---|---|
| 5,966,520 | A * | 10/1999 | Buer | ............... H03F 3/604 330/286 |
| 6,424,006 | B1 * | 7/2002 | Ponse | ............... H01L 23/4824 257/341 |
| 6,724,067 | B2 * | 4/2004 | Bayraktaroglu | .... H01L 21/8252 257/579 |
| 10,276,671 | B2 * | 4/2019 | Ozaki | ............... H03F 3/245 |
| 2002/0140007 | A1 * | 10/2002 | Sakamoto | ........... H01L 23/5221 257/276 |
| 2004/0058485 | A1 | 3/2004 | Makiyama et al. | |
| 2009/0189200 | A1 | 7/2009 | Takagi | |
| 2012/0133440 | A1 * | 5/2012 | Matsushita | ......... H01L 23/4821 330/277 |
| 2012/0267795 | A1 * | 10/2012 | Shimura | ............ H01L 23/4821 257/776 |
| 2013/0056875 | A1 | 3/2013 | Nogami et al. | |
| 2014/0103434 | A1 * | 4/2014 | Lu | .................... H01L 29/41758 257/346 |
| 2014/0306231 | A1 | 10/2014 | Ozaki et al. | |
| 2015/0060946 | A1 | 3/2015 | Makiyama | |
| 2016/0042994 | A1 | 2/2016 | Maeda et al. | |

FOREIGN PATENT DOCUMENTS

| | | |
|---|---|---|
| JP | 2009-176930 A | 8/2009 |
| JP | 2013-055126 A | 3/2013 |
| JP | 2014-209522 A | 11/2014 |
| JP | 2015-046445 A | 3/2015 |
| JP | 2016-039319 A | 3/2016 |

OTHER PUBLICATIONS

International Search Report; Written Opinion; and Notification of Transmittal of the International Search Report and the Written Opinion of the International Searching Authority, or the Declaration issued in PCT/JP2017/014100; dated Jun. 20, 2017.
An Office Action mailed by Taiwanese Patent Office dated Oct. 19, 2018, which corresponds to Taiwanese Patent Application No. 106116429.

* cited by examiner

SEMICONDUCTOR DEVICE AND METHOD FOR MANUFACTURING SAME

FIELD

The present invention relates to a semiconductor device wherein a hollow structure sealed with a resin film is formed, and a method for manufacturing same.

BACKGROUND

High electron mobility transistors (HEMTs) formed of compound semiconductors are applied to microwave and millimeter wave amplifiers because they have excellent high frequency characteristics and low noise characteristics. In order to enhance the high frequency characteristics of HEMT, it is necessary to enhance the cutoff frequency ($f_t$) and the maximum operating frequency ($f_{max}$). Increase in mutual conductance and reduction in the capacitance between a gate electrode and a source electrode are effective means for enhancing $f_t$ and $f_{max}$.

On the other hand, with respect to HEMTs to which a wafer level package technique is applied, it has been reported that the capacitance increases and the high frequency characteristics deteriorate because a resin film is filled under a ridge portion of a Y-type gate, (for example, see Non-Patent Literature 1). In order to solve this problem, removal of a resin film around a gate electrode is known as means for preventing deterioration of the high frequency characteristics (for example, see Patent Literatures 1 to 3). Moreover, since an increase in capacitance is suppressed as much as possible in addition to formation of a hollow structure around the gate electrode, a transistor in which the hollow structure is extended to the peripheries of source and drain electrodes, and a method for manufacturing the same have been proposed (for example, see Patent Literatures 4 and 5).

CITATION LIST

Patent Literature

[PTL 1] JP H05-335343 A
[PTL 2] JP 2015-046445 A
[PTL 3] JP 2016-039319 A
[PTL 4] JP 2014-209522 A
[PTL 5] JP 2009-176930 A

Non Patent Literature

[NPL n] T. Hisakal, H. Sasakil, T. Katohl, K. Kanayal, N. Yoshidal, A. A. Villanueva, and J. A. del Alamo, IEICE Electronics Express, Vol. 7, No. 8, P. 558-562

SUMMARY

Technical Problem

However, in a structure in which the resin film is not formed over the entire transistor, there is a problem that resists and chemicals such as an inorganic aqueous solution used in subsequent steps enter the hollow structure from the gap between the resin film and the electrode. Furthermore, in a semiconductor device to which the wafer level package technique is applied, wiring portions other than the transistor are covered with the resin film, so that the capacitance of the entire device increases. As a result, there has been a problem that high frequency characteristics such as gain or noise characteristics deteriorate.

The present invention has been made to solve the problems as described above, and has an object to provide a semiconductor device capable of preventing chemicals from entering the hollow structure and enhancing the high frequency characteristics by reducing the capacitance, and a method for manufacturing same.

Solution to Problem

A semiconductor device according to the present invention includes: a semiconductor substrate; a multi-finger transistor including plural control electrodes, plural first electrodes, and plural second electrodes provided on the semiconductor substrate; a resin film covering the transistor, and a first wiring provided on the resin film and electrically connecting the plural first electrodes to one other, wherein the resin film covers contact portions between the first wiring and the plural first electrodes, and a first hollow structure sealed with the resin film is provided around the plural control electrodes and the plural second electrodes.

Advantageous Effects of Invention

In the present invention, the first hollow structure sealed with the resin film is formed around the plural control electrodes and the plural second electrodes. By expanding the hollow structure of the transistor as described above, the capacitance of the transistor can be reduced as much as possible as compared with a case where the hollow structure is formed only around the control electrodes. As a result, the capacitance can be reduced to enhance the high frequency characteristics. The resin film covers the contact portion between the first wiring and the first electrode. Therefore, resists or chemicals such as an inorganic aqueous solution which are used in steps after formation of the first hollow structure can be prevented from entering the first hollow structure.

DESCRIPTION OF EMBODIMENTS

A semiconductor device and a method for manufacturing same according to the embodiments of the present invention will be described with reference to the drawings. The same components will be denoted by the same symbols, and the repeated description thereof may be omitted.

First Embodiment

Figure 1:
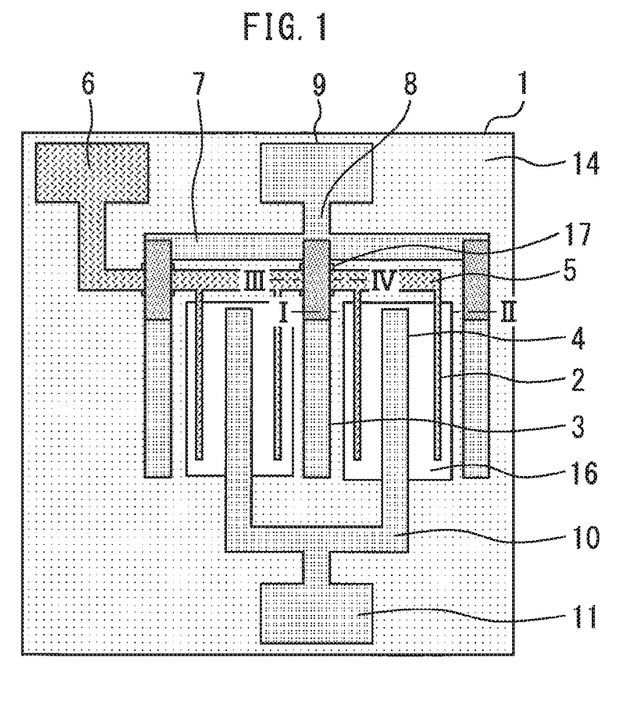
FIG. 1 is a plan view showing a semiconductor device according to a first embodiment of the present invention.
Figure 2:
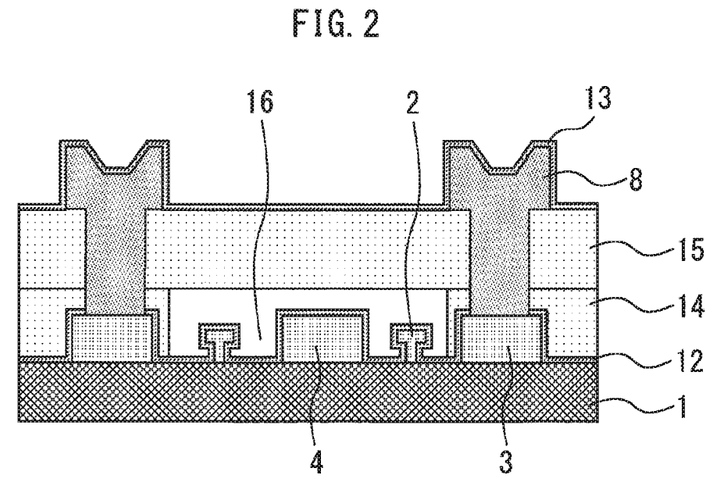
FIG. 2 is a cross-sectional view taken along I-IT of FIG. 1.
Figure 3:
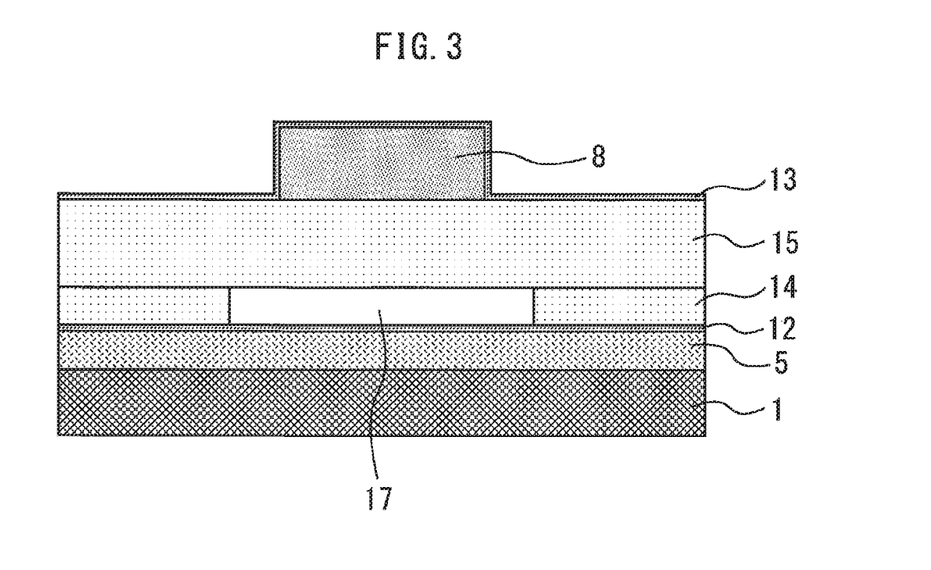
FIG. 3 is a cross-sectional view taken along III-IV of FIG. 1.

FIG. 1 is a plan view showing a semiconductor device according to a first embodiment of the present invention. FIG. 2 is a cross-sectional view taken along I-II of FIG. 1. FIG. 3 is a cross-sectional view taken along III-IV of FIG. 1. A multi-finger field effect transistor including plural gate electrodes 2, plural source electrodes 3, and plural drain electrodes 4 is formed on a semiconductor substrate 1. The cross-sectional shape of the gate electrode 2 is T-type or Y-type. The plural gate electrodes 2 are connected to a gate pad 6 via a gate wiring 5. The plural source electrodes 3 are connected to a source pad 9 via a source wiring 7 and a connection wiring 8. The plural drain electrodes 4 are connected to a drain pad 11 via a drain wiring 10.

Insulating films 12 and 13 and resin films 14 and 15 cover the transistor. The connection wiring 8 is formed on the resin film 15. The connection wiring 8 and the source wiring 7 electrically connect the plural source electrodes 3 to one other. The resin film 14 covers contact portions between the connection wiring 8 and the plural source electrodes 3. Hollow structures 16 sealed with the resin films 14 and 15 are formed around the plural gate electrodes 2 and the plural drain electrodes 4. Furthermore, a hollow structure 17 sealed with the resin films 14 and 15 is formed at an intersection portion of the gate wiring 5 and the connection wiring 8.

The thicknesses of the resin films 14 and 15 are equal to 2 to 20 µm. The heights of the hollow structures 16 and 17 are equal to 1 to 10 µm. The widths and depths of the hollow structures 16 and 17 are equal to several µm to several hundreds µm. The hollow structures 16 and 17 are formed not over the whole chip, but for each of elements of a circuit such as a transistor and a wiring.

Figure 4:
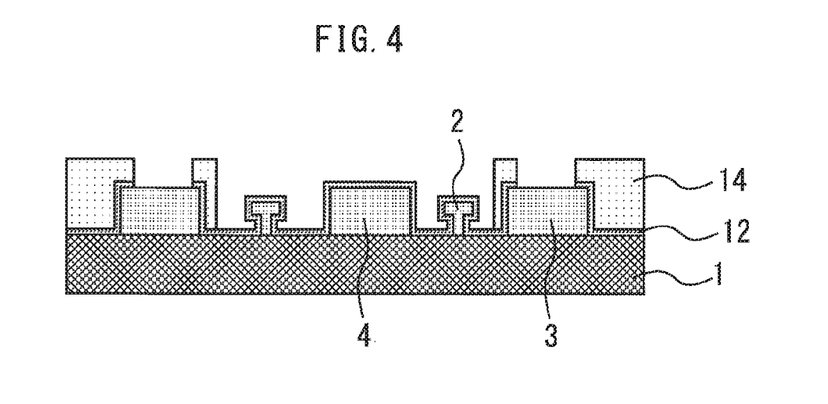
FIG. 4 is a cross-sectional view showing the method of manufacturing a semiconductor device according to the first embodiment of the present invention.

Subsequently, a method of manufacturing a semiconductor device according to the present embodiment will be described. FIGS. 4 to 8 are cross-sectional views showing the method of manufacturing a semiconductor device according to the first embodiment of the present invention. FIGS. 4, 6 and 8 correspond to the cross-sectional view of FIG. 2, and FIGS. 5 and 7 correspond to the cross-sectional view of FIG. 3.

Figure 5:
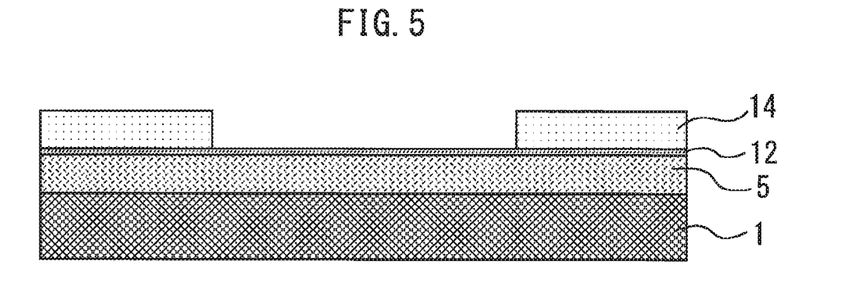
FIG. 5 is a cross-sectional view showing the method of manufacturing a semiconductor device according to the first embodiment of the present invention.
Figure 6:
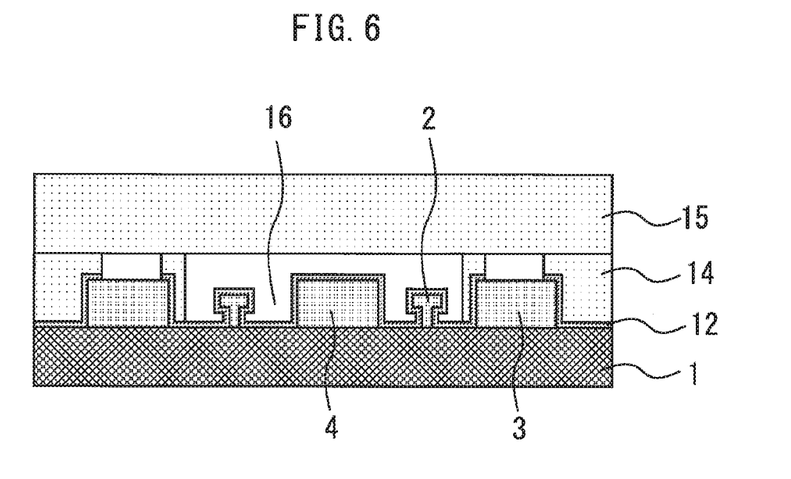
FIG. 6 is a cross-sectional view showing the method of manufacturing a semiconductor device according to the first embodiment of the present invention.

First, as shown in FIGS. 4 and 5, a transistor having the gate electrodes 2, the source electrodes 3, and the drain electrodes 4 is formed on the semiconductor substrate 1. At this time, lower layer wirings such as the gate wiring 5 are simultaneously formed. The insulating film 12 is formed on the entire surface. The insulating film 12 is opened at a place to which an electrical wiring is connected in a subsequent step. Next, the resin film 14 which is a photosensitive resin film is formed on the entire surface by a coating method using a spin coater, or a laminating method, or an STP (Spin-coating film Transfer and hot-Pressing technology) method. The resin film 14 is subjected to patterning by exposure and development so that the source electrodes 3 are covered while the gate electrodes 2 and the drain electrodes 4 are not covered, but surrounded. By using the photosensitive resin film as described above, the resin film 14 can be easily patterned. Furthermore, the resin film 14 is also opened in a region on the gate wiring 5 which will become the intersection portion of the wirings later. Thereafter, curing processing is performed to cure the resin film 14.

Figure 7:
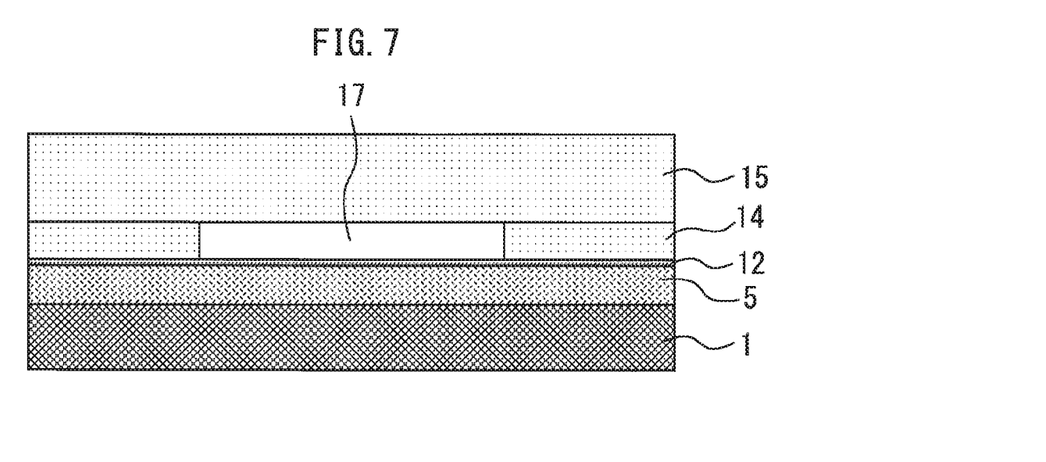
FIG. 7 is a cross-sectional view showing the method of manufacturing a semiconductor device according to the first embodiment of the present invention.
Figure 8:
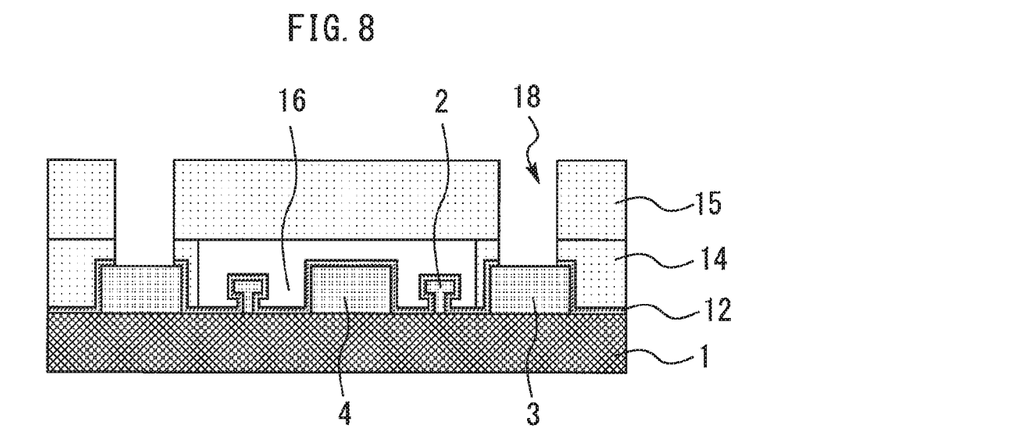
FIG. 8 is a cross-sectional view showing the method of manufacturing a semiconductor device according to the first embodiment of the present invention.

Next, as shown in FIGS. 6 and 7, a sheet film of a photosensitive resin film as the resin film 15 is bonded to the upper surface of the resin film 14 by the laminating method or the STP method. As a result, the hollow structure 16 sealed with the resin films 14 and 15 is formed around the gate electrodes 2 and the drain electrode 4. At the same time, the hollow structure 17 can be formed in a region above the gate wiring 5 on the same plane.

Next, as shown in FIG. 8, the resin film 15 is exposed and developed to form through holes 18 above the source electrodes 3 and the like. Thereafter, the curing processing is performed to cure the resin film 15. The resin film 15 may be non-photosensitive resin, and in this case, dry etching is used when the through holes 18 are formed.

Next, the connection wiring 8 connected to the source electrodes 3 through the through holes 18 is formed on the resin film 15 by plating or vapor deposition. In the case of the plating, a power supply layer is formed, patterning is performed with a resist, and then electrolytic plating is performed. Thereafter, the resist and the power supply layer are removed. On the other hand, in the case of the vapor deposition method, patterning is performed with a resist, a metal film is formed by vapor deposition, and the resist is removed by a lift-off method. Finally, the outside of the resin film 14 and the outside of the resin film 15 are covered with the insulating film 13. However, portions required for contacts are opened. As a result, the semiconductor device according to the present embodiment is manufactured.

In the present embodiment, the hollow structures 16 sealed with the resin films 14 and 15 are formed around the gate electrodes 2 and the drain electrodes 4. By expanding the hollow structures of the transistor as described above, the capacitance of the transistor can be reduced as much as possible as compared with a case where the hollow structures are formed only around the gate electrodes 2. As a result, the capacitance can be reduced to enhance the high frequency characteristics.

The resin film 14 covers the contact portion between the connection wiring 8 and the source electrode 3. As a result, when the resin film 15 is pasted as shown in FIG. 6, the hollow structures 16 are completely sealed. Therefore, resists or chemicals such as an inorganic aqueous solution which are used in steps after formation of the hollow structures 16 can be prevented from entering the hollow structures 16.

Furthermore, the hollow structure 17 sealed with the resin films 14 and 15 is formed at the intersection portion of the gate wiring 5 and the connection wiring 8. By forming the hollow structure between the wirings as described above, the wiring capacitance can be reduced, so that characteristic impedance can be increased. Therefore, impedance matching can be easily achieved, and circuit design can be facilitated. Note that the hollow structure 17 may be formed at an intersection portion of the gate wiring 5 and the drain wiring 10.

Second Embodiment

Figure 9:
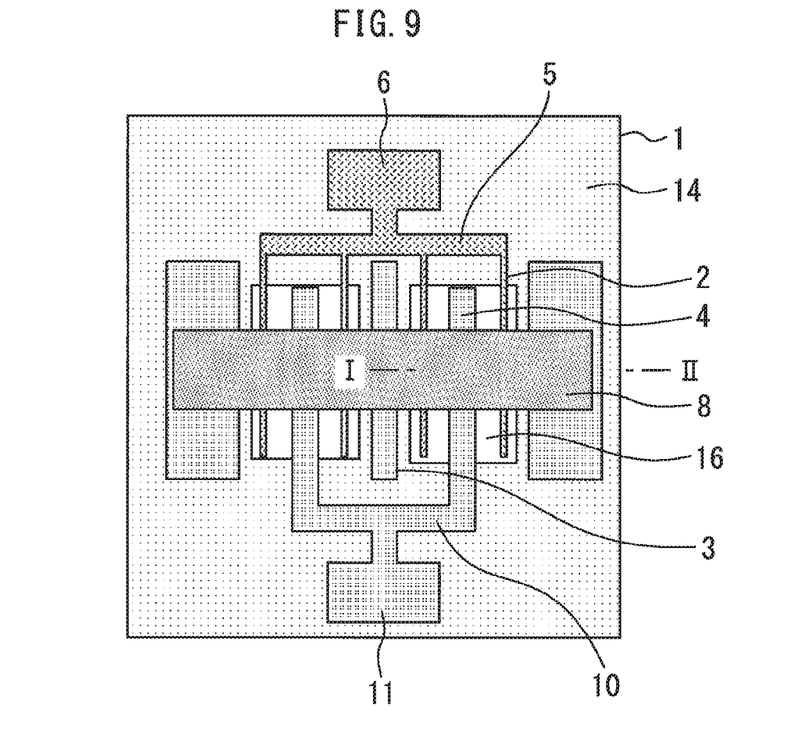
FIG. 9 is a plan view showing a semiconductor device according to a second embodiment of the present invention.
Figure 10:
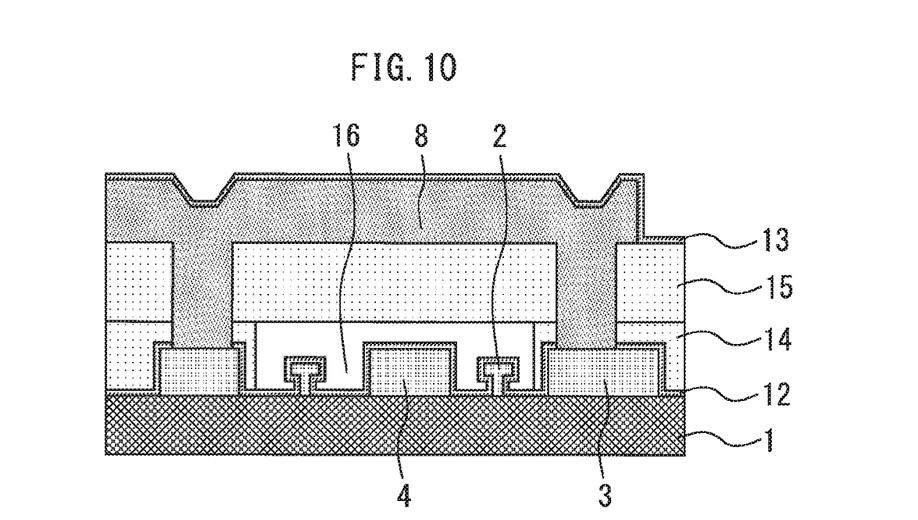
FIG. 10 is a cross-sectional view taken along I-II of FIG. 9.

FIG. 9 is a plan view showing a semiconductor device according to a second embodiment of the present invention. FIG. 10 is a cross-sectional view taken along I-II of FIG. 9. The connection wiring 8 is formed above the plural gate electrodes 2 and the plural drain electrodes 4 and on the resin film 15, and electrically connects the plural source electrodes 3 to another. The connection wiring 8 extends in a direction perpendicular to the longitudinal direction of the drain electrodes 4. The other configuration is the same as that of the first embodiment, and even in this case, the same effect as the first embodiment can be obtained.

Third Embodiment

Figure 11:
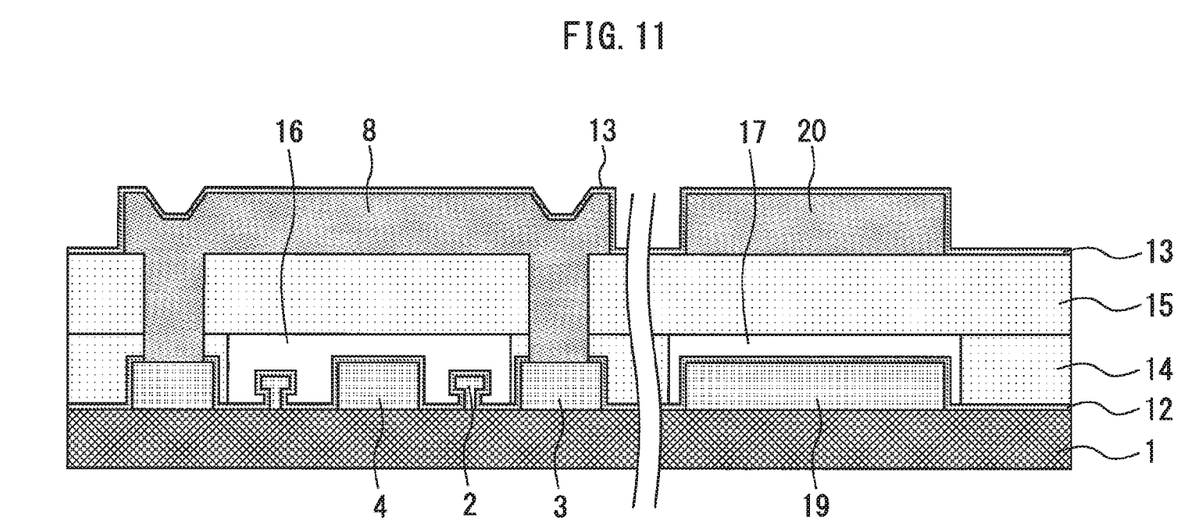
FIG. 11 is a cross-sectional view showing a semiconductor device according to a third embodiment of the present invention.

FIG. 11 is a cross-sectional view showing a semiconductor device according to a third embodiment of the present invention. A lower layer wiring 19 and an upper layer wiring 20 are formed in a region other than a field effect transistor. The lower layer wiring 19 is covered with the resin films 14 and 15, and the upper layer wiring 20 is formed on the resin film 15. The hollow structure 17 sealed with the resin films 14 and 15 is formed at an intersection portion of the lower layer wiring 19 and the upper layer wiring 20. By forming the hollow structure between the wirings as described above, the wiring capacitance can be reduced, so that characteristic impedance can be increased. Therefore, impedance matching can be easily achieved, and circuit design can be facilitated. The other configuration and effect are the same as the second embodiment.

Fourth Embodiment

Figure 12:
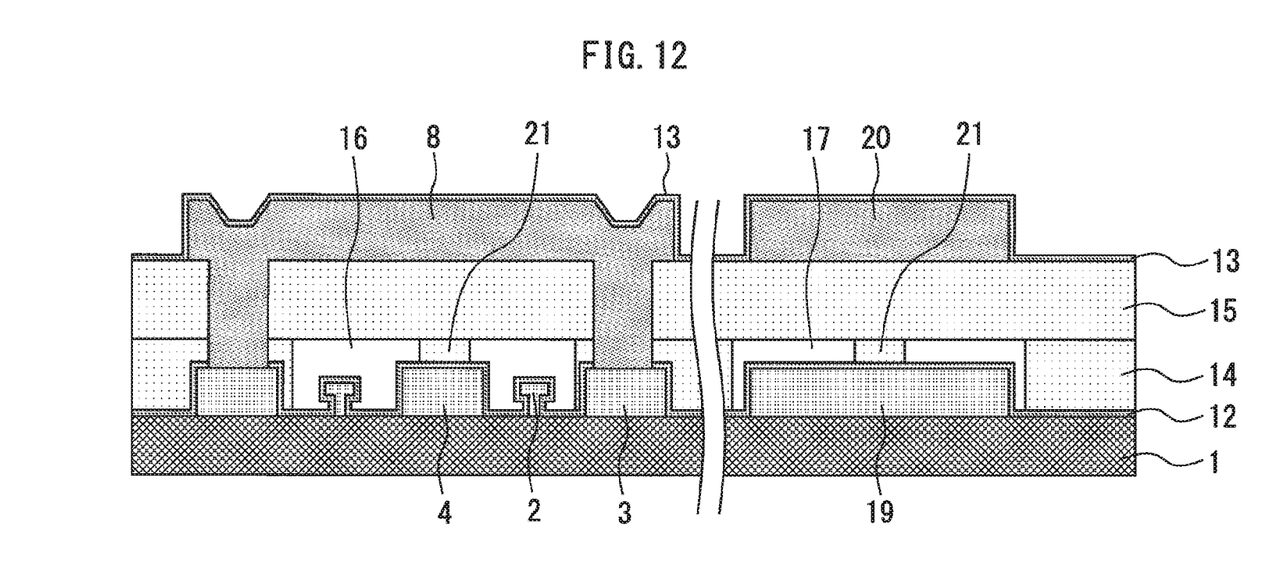
FIG. 12 is a cross-sectional view showing a semiconductor device according to a fourth embodiment of the present invention.

FIG. 12 is a cross-sectional view showing a semiconductor device according to a fourth embodiment of the present invention. Support poles 21 for supporting the resin film 15 above the hollow structures 16 and 17 are formed inside the hollow structures 16 and 17. As a result, it is possible to prevent the resin film 15 from hanging down and prevent defects in the process. Although the capacitance of the device is increased as compared with the third embodiment, the structure can be stably formed, so that production stability is enhanced. The other configuration and effect are the same as the third embodiment.

Fifth Embodiment

Figure 13:
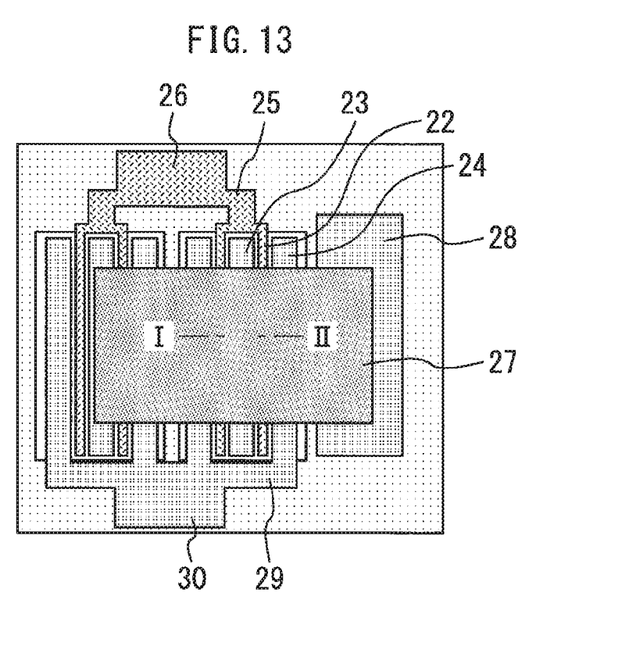
FIG. 13 is a plan view showing a semiconductor device according to a fifth embodiment of the present invention.
Figure 14:
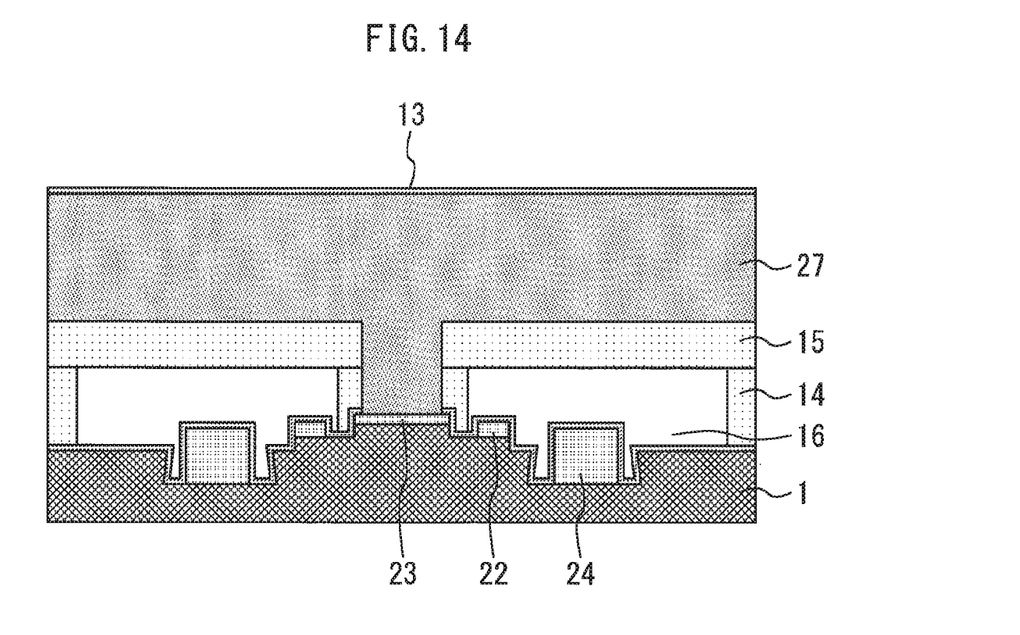
FIG. 14 is a cross-sectional view taken along I-II of FIG. 13.

FIG. 13 is a plan view showing a semiconductor device according to a fifth embodiment of the present invention. FIG. 14 is a cross-sectional view taken along I-II of FIG. 13. A multi-finger bipolar transistor including plural base electrodes 22, plural emitter electrodes 23, and plural collector electrodes 24 is formed on a semiconductor substrate 1. The plural base electrodes 22 are connected to a base pad 26 via a base wiring 25. The plural emitter electrodes 23 are connected to an emitter pad 28 via a connection wiring 27. The plural collector electrodes 24 are connected to a collector pad 30 via a collector wiring 29.

The connection wiring 27 for electrically connecting the plural emitter electrodes 23 to each other is formed on the resin film 15. The resin film 14 covers contact portions between the connection wiring 27 and the plural emitter electrodes 23. The hollow structures 16 sealed with the resin films 14 and 15 are formed around the plural base electrodes 22 and the plural collector electrodes 24. Even in the case of such a bipolar transistor, the same effect as the first and second embodiments can be obtained.

Furthermore, as in the third embodiment, the second hollow structure may be formed at the intersection portion of the wirings. As a result, since the wiring capacitance is reduced, the characteristic impedance can be increased. Therefore, impedance matching can be easily achieved, and circuit design can be facilitated.

REFERENCE SIGNS LIST 1 semiconductor substrate; 2 gate electrode (control electrode); 3 source electrode (first electrode); 4 drain electrode (second electrode); 5 gate wiring (second wiring); 8,27 connection wiring (first wiring); 14,15 resin film; 16,17 hollow structure; 19 lower layer wiring; 20 upper layer wiring; 21 support pole; 22 base electrode (control electrode); 23 emitter electrode (first electrode); 24 collector electrode (second electrode)

The invention claimed is:
1. A semiconductor device comprising:
   a semiconductor substrate;
   a multi-finger transistor including plural control electrodes, plural first electrodes, and plural second electrodes provided on the semiconductor substrate;
   a first resin film formed on the semiconductor substrate;
   a second resin film covering the multi-finger transistor and contacting the first resin film; and
   a first wiring provided on the second resin film and electrically connecting the plural first electrodes to one other, wherein
   the first resin film covers part of contact portions between the first wiring and the plural first electrodes which is formed on a region of the multi-finger transistor, and
   a first hollow structure sealed with the second resin film is provided around the plural control electrodes and one of the plural second electrodes, wherein
   the second resin film defines an upper surface of the first hollow structure.
2. The semiconductor device according to claim 1, further comprising
   a second wiring provided on the semiconductor substrate, covered with the second resin film, and electrically connecting the plural control electrodes to one other, wherein
   a second hollow structure sealed with the second resin film is provided at an intersection portion of the first wiring and the second wiring.
3. The semiconductor device according to claim 1, wherein
   the first wiring is provided above the plural control electrodes and the plural second electrodes.
4. The semiconductor device according to claim 3, further comprising
   a lower layer wiring covered with the second resin film, and an upper layer wiring provided on the second resin film, wherein
   a second hollow structure sealed with the second resin film is provided at an intersection portion of the lower layer wiring and the upper layer wiring.
5. The semiconductor device according to claim 4, further comprising a support pole supporting the second resin film and provided inside the second hollow structure.

\* \* \* \* \*